United States Patent [19]
Nakayama

[11] Patent Number: 5,841,271
[45] Date of Patent: Nov. 24, 1998

[54] TEST MODE POWER CIRCUIT FOR INTEGRATED-CIRCUIT CHIP

[75] Inventor: Hiroshi Nakayama, Tokyo, Japan

[73] Assignee: NEC Corporation, Tokyo, Japan

[21] Appl. No.: 906,824

[22] Filed: Aug. 6, 1997

Related U.S. Application Data

[63] Continuation of Ser. No. 341,076, Nov. 17, 1994, abandoned.

[30] Foreign Application Priority Data

Nov. 17, 1993 [JP] Japan ................................ 5-309669

[51] Int. Cl.$^6$ ...................................................... G05F 3/16
[52] U.S. Cl. ........................... 323/316; 323/353; 323/298
[58] Field of Search .............................. 307/42; 327/556, 327/530; 323/369, 298, 316, 353

*Primary Examiner*—Shawn Riley
*Attorney, Agent, or Firm*—Foley & Lardner

[57] ABSTRACT

A power supply circuit for an integrated-circuits chip includes variable resistors for establishing an internal voltage for the chip. The internal voltage is variable with the variable resistors and compared by a comparator to a test voltage supplied from an external test circuit. A first buffer amplifier, powered by an externally supplied voltage, amplifies the output of the comparator to produce output voltages of opposite polarities. A second buffer amplifier, powered by the externally supplied voltage, amplifies the output voltages of the first buffer amplifier to supply an output voltage to the test circuit. In a modified embodiment, a second voltage source is additionally provided to establish a second internal voltage higher than the internal voltage produced by the first reference voltage source. The first buffer amplifier is powered by the second internal voltage, instead of by the first internal voltage, to amplify the output of the comparator.

8 Claims, 4 Drawing Sheets

TEST MODE POWER CIRCUIT FOR INTEGRATED-CIRCUIT CHIP

This application is a continuation of application Ser. No. 08/341,076, filed Nov. 17, 1994, now abandoned.

BACKGROUND OF THE INVENTION

1. Field of the Invention

The present invention relates generally to integrated circuits, and more specifically to a test mode power circuit for the integrated circuits.

2. Description of the Related Art

In a conventional test mode power circuit of an integrated-circuits chip, an internal voltage is generated as a power supply for the internal circuitry of the chip due to difficulty of laying power lines from an external voltage supply to the interior of the chip. This internal voltage is adjusted during a fabrication process by the use of variable resistors and compared by a comparator to a test voltage supplied from an external test circuit, producing an output indicating whether the internal voltage is higher or lower than the test voltage. Because of the limitations imposed by the layout of the chip, the comparator output signal must propagate through a long path to the test circuit. First and second buffer amplifiers are used in the propagation path. Since the first buffer amplifier is located inside of the chip, the power supply of this amplifier is taken from the internal voltage source, while the power supply of the second is taken from the external sources However, since the internal voltage is used both for comparison to the test voltage and for powering the first buffer amplifier, the latter will not operate during the time prior to the adjustment of the variable resistors if the internal voltage is lower than the threshold voltage of the first buffer amplifier, thus narrowing the test range of the power supply circuit.

SUMMARY OF THE INVENTION

It is therefore an object of the present invention to provide a test mode power supply circuit for an integrated-circuit chip having a greater test range for internal power supply voltage.

According to a first aspect of the present invention, there is provided a power supply circuit for an integrated-circuit chip having a test circuit. The power supply circuit includes a variable resistor setting means for establishing an internal voltage for the integrated-circuit chip, the internal voltage being variable by adjustment of the variable resistor setting means, and a comparator for comparing the internal voltage to a test voltage supplied from the test circuit to produce an output voltage indicating whether the internal voltage is higher or smaller than the test voltage. A first buffer amplifier, powered by an externally supplied voltage, amplifies the output voltage of the comparator to produce at least one output voltage. A second buffer amplifier, powered by the externally supplied voltage, amplifies the output voltage of the first buffer amplifier to supply an output voltage to the test circuit.

According to a second aspect, the present invention provides a power supply circuit for an integrated-circuit chip having a test circuit, comprising a first voltage source including variable resistor setting means for establishing a first internal voltage for the integrated-circuit chip, the first internal voltage being variable by adjustment of the variable resistor setting means. A second voltage source establishes a second internal voltage higher than the first internal voltage. A comparator compares the first internal voltage to a test voltage supplied from the test circuit to produce an output voltage indicating whether the first internal voltage is higher or smaller than the test voltage. A first buffer amplifier, powered by the second internal voltage, amplifies the output voltage of the comparator and produces at least one output voltage, and a second buffer amplifier, powered by an externally supplied voltage, amplifies the output voltage of the first buffer amplifier and supplies an output voltage to the test circuit.

BRIEF DESCRIPTION OF THE DRAWINGS

The present invention will be described in further detail with reference to the accompanying drawings, in which.

DETAILED DESCRIPTION

Figure 1:
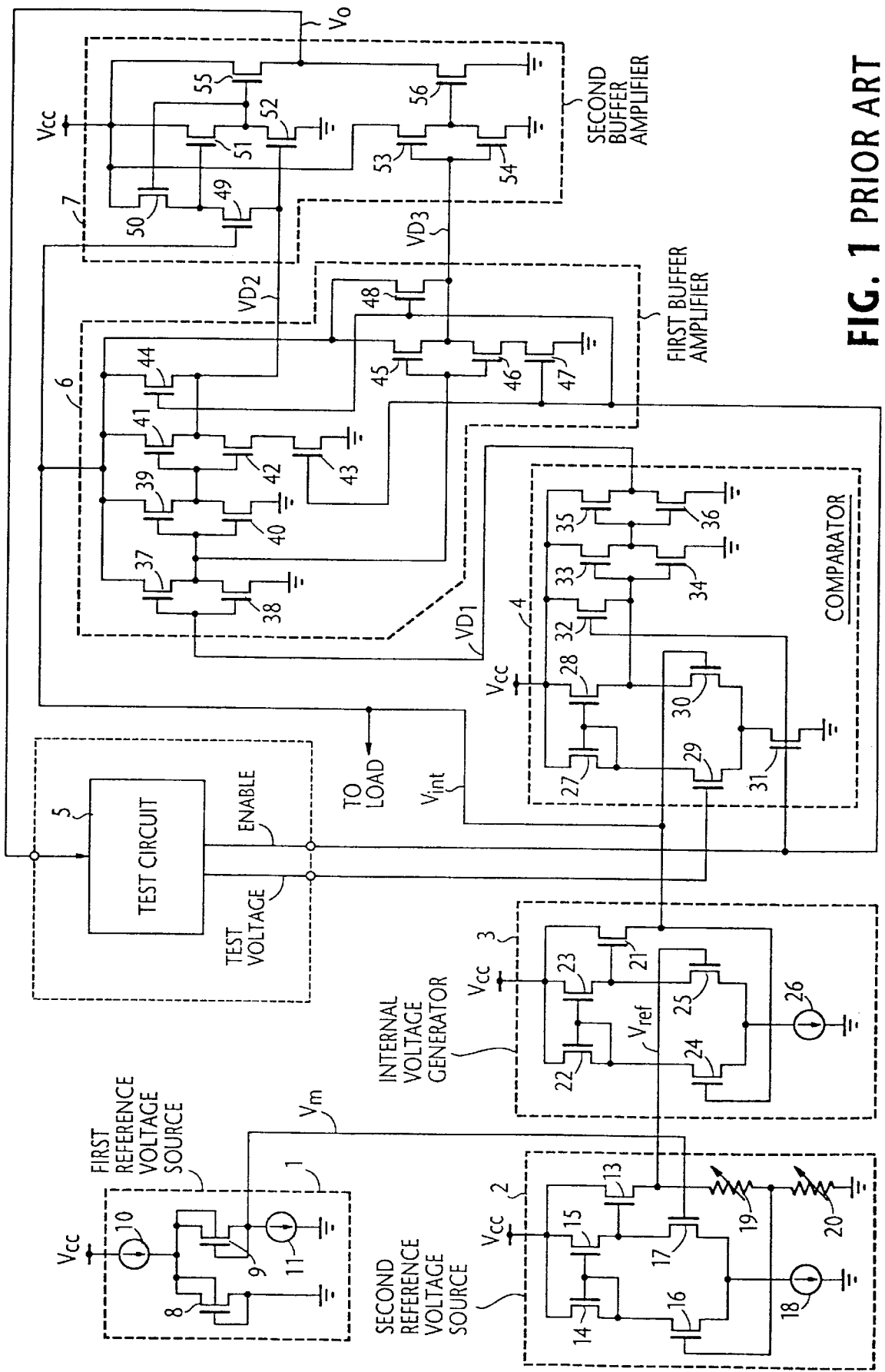
FIG. 1 is a block diagram of a prior art power supply circuit of an integrated-circuit chip.

Before proceeding with the detailed description of the present invention, it may prove helpful to provide an explanation of a prior art LSI power supply circuit with reference to the block diagram of FIG. 1. The prior art LSI power supply circuit generally comprises first and second reference voltage generators 1 and 2, an internal voltage generator 3 for generating a voltage $V_{int}$ for use within the LSI chip, a comparator 4 for making a comparison between the voltage $V_{int}$ and a test voltage supplied from an external test circuit 5, and a series connection of first and second buffer amplifiers 6, 7 connected to the output of comparator 4 to produce an output signal for coupling to the test circuit 5 as a result of the comparison.

Specifically, the first reference voltage source 1 includes a pair of PMOS transistors 8, 9 of identical gain with their sources connected together in a current mirror configuration to the external voltage supply $V_{cc}$ via current source 10, with the drain and gate of transistor 8 connected together to ground and the drain and gate of transistor 9 being connected together to ground via a constant current source 11. The transistors 8 and 9 are operated in their saturation region to develop a reference voltage $V_m$ across the constant current source 11. Since the gate of transistor 8 is grounded, the reference voltage $V_m$ is equal to the difference in absolute value between the threshold voltages of transistors 8 and 9. To develop a sufficient voltage $V_m$ the threshold voltage of transistor 8 is set at a value higher than that of transistor 9. The voltage $V_m$ is supplied to the second reference voltage source 2 as a reference voltage.

The second reference voltage source 2 is a current mirror, high open-loop gain differential amplifier formed with a pair of PMOS transistors 14, 15 with their sources connected together to the external voltage supply $V_{cc}$ to form a high open-loop gain current mirror, and a pair of NMOS transistors 16, 17 which form a differential amplifier. The drain of NMOS transistor 16 is connected to the input of the current mirror and the drain of NMOS transistor 17 is connected to the output of the current mirror to which the gate of a PMOS transistor 13 is also connected. The sources of NMOS transistors 16, 17 are connected together to a constant current source 18 which is grounded. Variable resistors 19 and 20 are connected in series between ground and the source-drain path of PMOS transistor 13 to the voltage supply $V_{cc}$. The reference voltage $V_m$ from the first reference voltage source is applied to the gate of NMOS transistor 17 and a voltage developed at the junction between variable resistors 19 and 20 is applied to the gate of NMOS transistor 16.

By virtue of the differential operation of the transistors 16, 17, the voltage at the junction between resistors 19, 20 is made equal to the input reference voltage $V_m$, and a voltage $V_{ref}$ develops at the junction between the drain of transistor 13 and resistor 19 as an output of the second reference voltage source 2. Therefore, voltage $V_{ref}$ is equal to $\{1+(R1/R2)\}V_m$, where R1 and R2 are the resistances of variable resistors 19 and 20. If there is a decrease (or increase) in voltage $V_{ref}$ from the normal level, there is a corresponding voltage drop (or rise) at the junction between resistors 19 and 20, which is fed back to the current mirror to produce a voltage drop (or rise) at the gate of PMOS transistor 21, As a result, there is an increase (or decrease) in current supplied from the external voltage supply $V_{cc}$ to the PMOS transistor 21 to (or decrease) voltage Vref. The feedback operation continues until voltage $V_{ref}$ returns to the normal level. The voltage $V_{ref}$ is supplied to the internal voltage generator 3.

The internal voltage generator 3 includes a pair of PMOS transistors 22, 23 with their sources connected together to the external voltage supply $V_{cc}$ to form a current mirror. Differential amplifier NMOS transistors 24, 25 are connected between the current mirror transistors 22, 23 and a constant current source 26 which is grounded. The internal voltage $V_{int}$ is established at the junction between the gate of NMOS transistor 24 and the drain of a PMOS transistor 21 whose gate and source are connected to the drain of transistor 23 and the voltage supply $V_{cc}$, respectively, to form a feedback circuit to keep the voltage $V_{int}$ at a constant level in the same manner as the second reference voltage source 2. The internal voltage $V_{int}$ is supplied the comparator 4 as well as to the load circuit of the LSI power circuit.

The comparator 4 is comprised by current mirror PMOS transistors 27, 28 connected to the voltage supply $V_{cc}$ and differential amplifier NMOS transistors 29, 30 connected between the current mirror transistors and an NMOS switching transistor 31 which is grounded. The test voltage from the test circuit 5 is coupled to the gate of transistor 29 and the internal voltage $V_{int}$ is coupled to the gate of transistor 30. Switching transistor 31 is turned on in response to an enable pulse which is supplied from the test circuit during a test mode. The enable pulse is also supplied to the gate of a PMOS switching transistor 32 whose source-drain path is connected in parallel with the source-drain path of transistor 28. A pair of a PMOS transistor 33 and an NMOS transistor 34 is provided having their gates connected together and their source-drain paths connected in series between the voltage supply $V_{cc}$ and ground to form a first CMOS inverter, with the junction at their gates serving the input of the first CMOS inverter and coupled to the drain of transistor 32 and the junction at their source-drain paths being the output of the first CMOS inverter. A second CMOS inverter is likewise formed by a pair of PMOS transistor 35 and an NMOS transistor 36, the input of the second CMOS inverter being connected to the output of the first CMOS inverter.

The NMOS switching transistor 31 is normally in the OFF state to disable the current mirror differential amplifier, while the PMOS switching transistor 32 is normally in the ON state and therefore the output of the second CMOS inverter is normally at zero voltage level. In response to an enable pulse from the test circuit, the NMOS switching transistor 31 is turned on to allow the current mirror differential amplifier to develop a difference voltage between the test voltage and the internal voltage $V_{int}$ at the junction between transistors 28 and 30, while the PMOS transistor 32 is turned off to allow the inverter transistors 33 to 36 to respond to the difference voltage to produce a clearly defined voltage $VD_1$ at the output of the comparator 4 during the test mode. As will be described, to measure the voltage $V_{int}$ the output voltage of the second buffer amplifier 7 is checked to see if it is 1 or 0 while varying the test voltage in a specified range.

The voltage $VD_1$ from comparator 4 is supplied to the first buffer amplifier 6 which is also enabled during the test mode, and the output of the first buffer amplifier 6 is connected to the input of the second buffer amplifier 7. The purpose of the first and second buffer amplifiers is to offset the attenuation of the output signal of the comparator as it propagates through the LSI chip to the test circuit S. The first buffer amplifier 6 is fabricated in an inner location of the LSI chip that is far removed from the external access points of the voltage supply $V_{cc}$. Because of the difficulty to form power lines as well as ground lines from the external access points to the inner location of the chip, the first buffer amplifier 6 uses the internal voltage $V_{int}$ as a power voltage.

The first buffer amplifier 6 includes a first CMOS inverter formed by a pair of a PMOS transistor 37 and an NMOS transistor 38 and a second CMOS inverter formed with a pair of a PMOS transistor 39 and an NMOS transistor 40, with the sources of the transistors 37 and 39 being connected to the output-of internal voltage generator 3. The output of the comparator 4-is applied to the input of the first CMOS inverter transistors 37, 38 and the output of the first CMOS inverter is applied to the input of a the second CMOS inverter transistors 39, 40 and to a first input of a second NAND gate formed with PMOS transistors 45, 48 and NMOS transistors 46, 47. The output of the second CMOS inverter is connected to a first input of a first NAND gate formed with PMOS transistors 41, 44 and NMOS transistors 42, 43. The sources of the PMOS transistors 41, 44, 45 and 48 are connected to the internal voltage supply $V_{int}$. The enable pulse from the test circuit 5 is applied to the second inputs of the first and second NAND gates, i.e., the gates of NIMOS transistors 43, 47 and the gates of PMOS transistors 44, 48. With this arrangement, the output voltage of the comparator 4 is amplified by the first and second CMOS inverter transistors 37–40 and the application of an enable pulse to the first buffe amplifier 6 causes a voltage $VD_2$ (which is inverse to $VD_1$) to appear at the drain of PMOS transistor 44 whose source-drain path is in shunt with that of PMOS transistor 41 and causes a voltage $VD_3$ (which is inverse to $VD_2$) to appear at the drain of PMOS transistor 48 whose source-drain path is in shunt with that of transistor 45. Therefore, the output voltages $VD_2$ and $VD_3$ can vary in the range between the ground potential and the internal voltage $V_{int}$.

The second buffer amplifier 7 is fabricated in a location close to the external access points of the voltage supply $V_{cc}$ and includes an NMOS transfer gate transistor 49 having its gate connected to the internal voltage supply $V_{int}$ and its source-drain path connected to the drain of transistor 44 for coupling the voltage $VD_2$ to the drain of a PMOS feedback transistor 50 whose source is connected to the external voltage supply $V_{cc}$. A first CMOS inverter is formed with a PMOS transistor 51 and an NMOS transistor 52, with their source-drain paths being connected between the voltage supply Vcc and ground. The gate of transistor 51 is connected to receive the voltage $VD_2$ from the transmission gate transistor 49, the gate of transistor 52 being connected to receive the voltage $VD_2$ direct from the drain of transistor 44. The junction between the first CMOS transistors 51 and 52 is connected to the gate of transistor 50 to form a feedback path and further connected to the gate of an NMOS transistor 55. On the other hand, the output voltage $VD_3$ is connected to the input of a second CMOS inverter formed with a PMOS transistor 53 and an NMOS transistor 54, with their source-drain paths being connected between the voltage supply $V_{cc}$ and ground. The junction between the second CMOS transistors 53, 54 is connected to the gate of an NMOS transistor 56 whose source-drain path is connected in series with the source-drain path of transistor 55 between the voltage supply $V_{cc}$ and ground.

In order to compensate for the difference in power supply voltage between the first and second buffer amplifiers 6 and 7, it is necessary to ensure that when there is a change in voltage $VD_2$ from low to high level, the gate of transistor 55 is driven sufficiently to low level. This is done by the feedback transistor 50 which feeds the gate voltage of NMOS transistor 55 back to the gate of transistor 51 so that the latter is driven to the level of voltage supply $V_{cc}$ from the level of the voltage $V_{int}$.

When the test voltage is lower than the internal voltage $V_{int}$, voltage $VD_1$ is low and voltages $VD_2$ and $VD_3$ are high and low, respectively, and transistors 55 and 56 are turned off and on, respectively, to produce a low level output. If the test voltage is higher than the internal voltage, transistors 55 and 56 are turned on and off, respectively, to produce a high level output.

During non-test modes, both of the voltages $VD_2$ and $VD_3$ are high and both of the transistors 55 and 56 are turned off, so that the output terminal $V_0$ of the second buffer amplifier 7 is maintained at a high impedance state.

Figure 2:
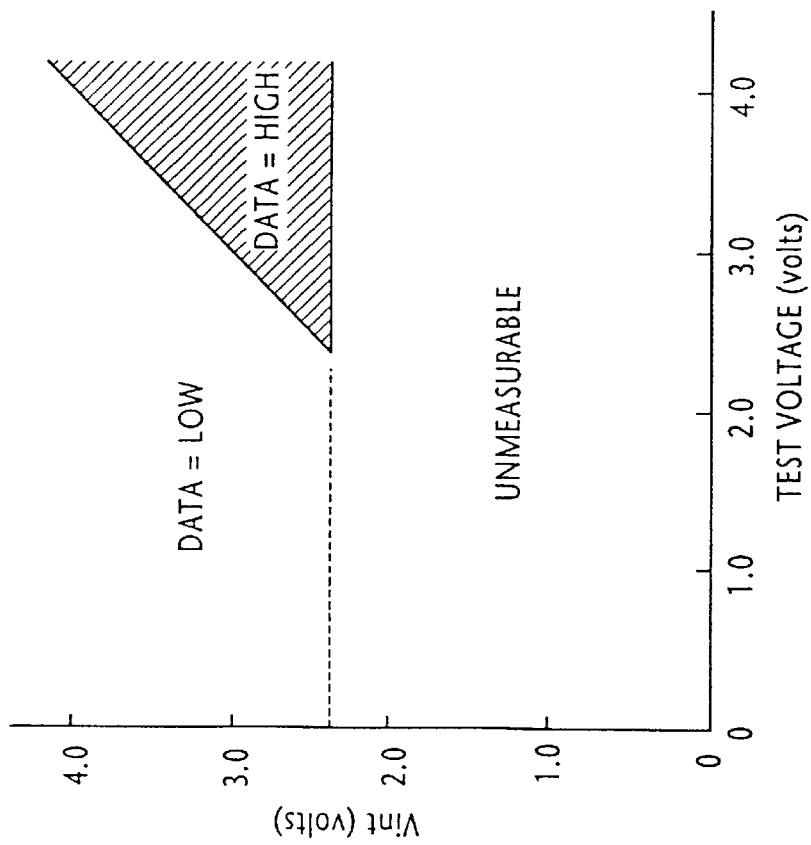
Fig. 2 is a Shmoo plot of the prior art power circuit.

Variable resistors 19 and 20 are trimmed to adjust the reference voltage $V_{ref}$ to a specified value. However, since the internal voltage is used for powering the first buffer amplifier 6 as well as for comparison with the test voltage, the threshold voltages of all transistors of the first buffer A amplifier are higher than those of the second buffer amplifier. As a result, during a fabrication process prior to the adjustment of variable resistors 19 and 20, the $V_{int}$-driven first buffer amplifier 6 does not operate as desired, and no valid output is produced by the second buffer amplifier 7 if the internal voltage $V_{int}$ is lower than 2.3 volts, as illustrated in the Shmoo plot of FIG. 2.

Figure 3:
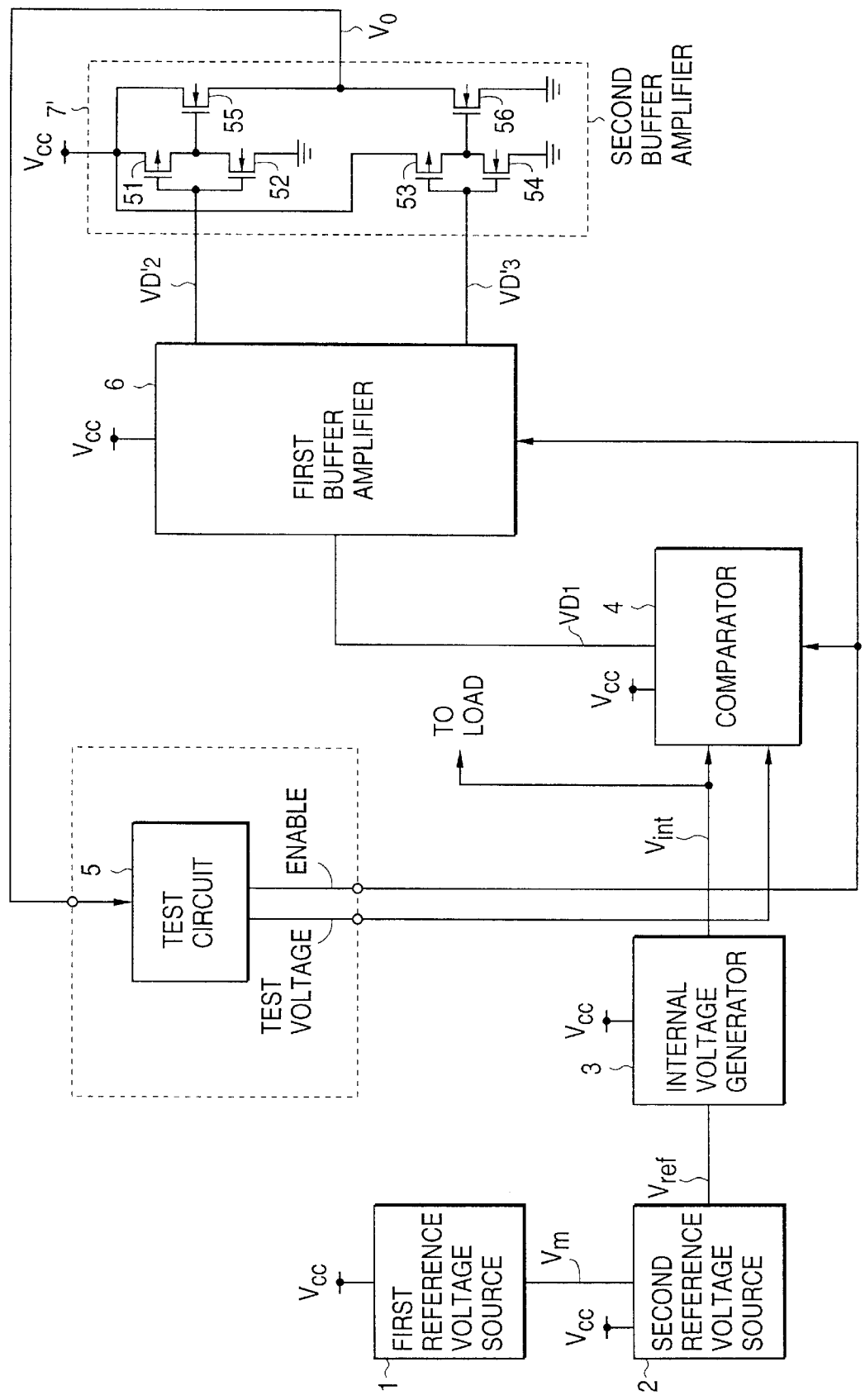
FIG. 3 is a block diagram of a power supply circuit according to a first embodiment of the present invention.

Referring now to FIG. 3, there is shown an LSI power circuit according to a first embodiment of the present Invention. In FIG. 3, parts corresponding to those in FIG. 1 are marked with the same numerals as those used in FIG. 1 and their details are not shown for simplicity. According to the first embodiment, the first buffer amplifier 6 is fabricated in a location of the LSI chip close to the external access points of the voltage supply $V_{cc}$ and power lines are laid out from the external access points to the amplifier 6, instead of from the internal voltage generator 3, to reduce the threshold variability of the transistors of amplifier 6. The first buffer amplifier 6 thus operates in the range between the external voltage $V_{cc}$ and ground potential and produces output voltages $VD'_2$ and $VD'_3$ which are higher than the voltages $VD_2$ and $VD_3$.

Since the first buffer amplifier 6 operates with $V_{cc}$, it is not necessary to provide $V_{int}$-$V_{cc}$ conversion. Thus, the transistors 49 and 50 of FIG. 1 are not employed and the voltage output $VD'_1$ from the $V_{cc}$-driven buffer amplifier 6 is directly applied to the gates of transistors 51 and 52 of the second buffer amplifier 7'.

Figure 4:
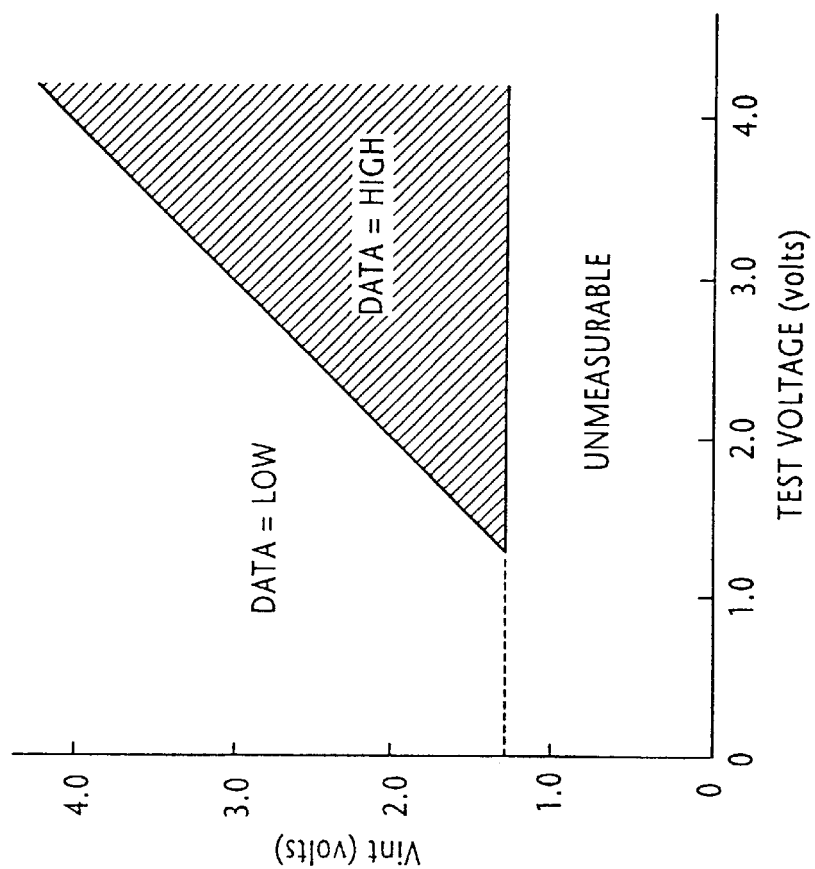
FIG. 4 is a Shmoo plot of the power supply circuit of the present invention.

Due to the use of a $V_{cc}$-driven buffer amplifier 6, the threshold voltages of its transistors are lowered to approximately 1.2 volts as illustrated in FIG. 4, increasing the range of voltages that can be measured.

Figure 5:
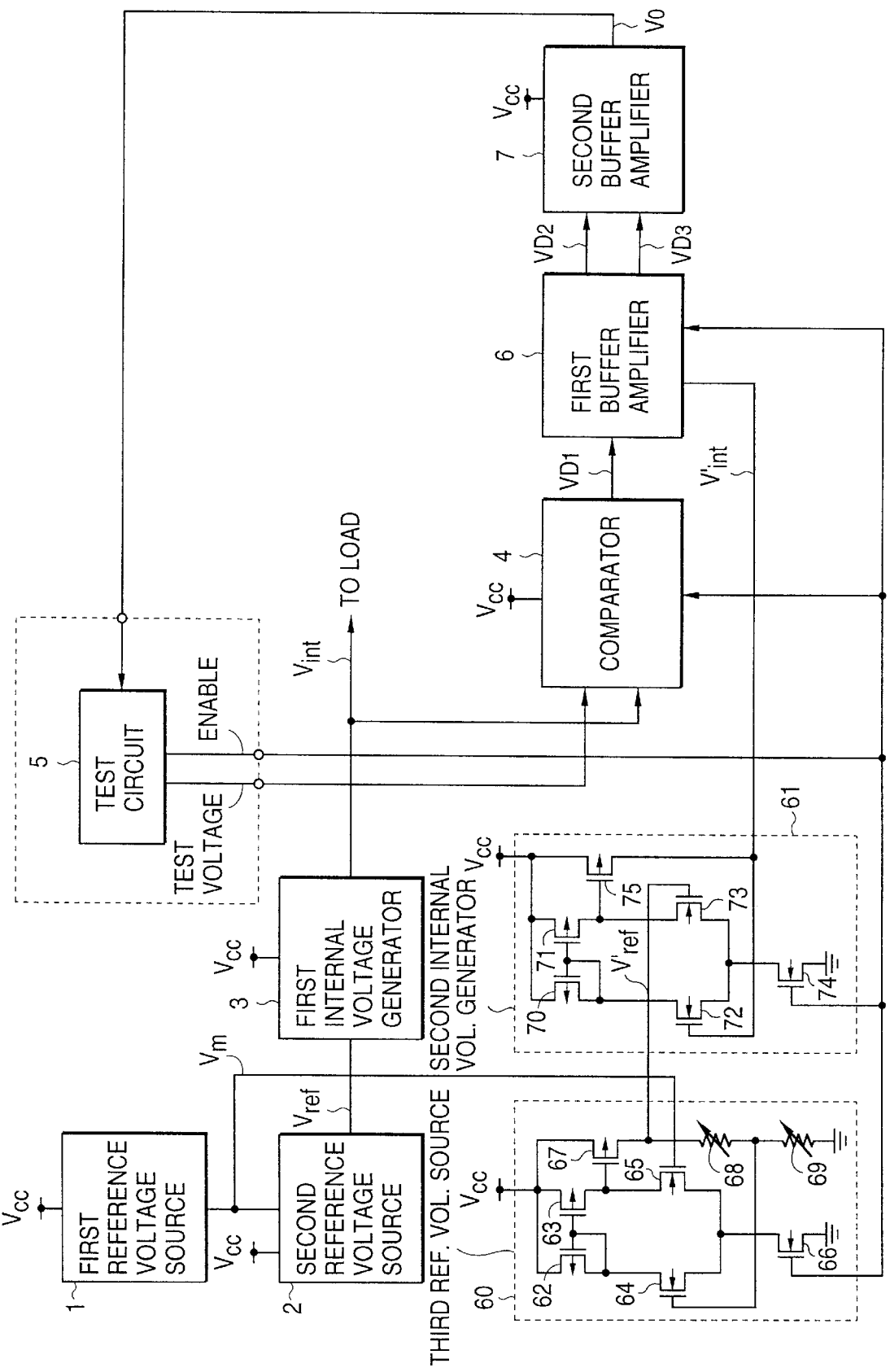
FIG. 5 is a block diagram of a power supply circuit according to a second embodiment of the present invention.

FIG. 5 shows the power circuit according to a second embodiment of this invention. According to this embodiment, a third reference voltage source 60 and a second internal voltage generator 61 are provided in addition to the first and second reference voltage sources 1, 2 and the first internal voltage generator 3. The third reference voltage source 60 is of generally similar configuration to the first reference voltage source, but it generates a reference voltage $V'_{ref}$ which is higher than the reference voltage $V_{ref}$ produced by the second reference voltage source 2. The second internal voltage generator 61 uses the reference voltage $V'_{ref}$ to generate a second internal voltage $V'_{int}$ which is higher than $V_{int}$. The first buffer amplifier 6 utilizes this second internal voltage $V'_{int}$ to activate its transistors to generate the pair of voltages $VD_2$ and $VD_3$ for the second buffer amplifier 7 identical to that of the first embodiment. The first internal voltage $V_{int}$ is applied to the comparator 4 as well as to the load circuit.

Specifically, the third reference voltage source 60 includes current mirror PMOS transistors 62, 63 and differential amplifier NMOS transistors 64, 65 and an AMOS transfer-gate transistor 66 which conducts in response to the enable pulse from the test circuit 5 for coupling the transistors 64, 65 to ground. The drains of NMOS transistors 64 and 65 are connected to the input and output of the current mirror, respectively. To the output of the current mirror is connected the gate of a PMOS transistor 67. Variable resistors 68 and 69 are connected in series between ground and the voltage supply $V_{cc}$, via the source-drain path of PMOS transistor 67. The reference voltage $V_m$ from the First reference voltage source 1 is applied to the gate of NMOS transistor 65 as well as to the second reference voltage source 2 and a voltage developed at the junction between variable resistors 68 and 69 is applied to the gate of NMOS transistor 64. Variable resistor 68 has a higher resistance value than that of resistor 19 of the second reference voltage source 2. The reference voltage $V'_{ref}$ is established by the third reference voltage source 60 and supplied to the second internal voltage generator 61.

The second internal voltage generator 61 includes a pair of PMOS 7 transistors 70, 71 with their sources connected together to the external voltage supply $V_{cc}$ to form a current mirror Differential amplifier transistors 72, 73 are connected between the current mirror transistors 70, 71 and a transfer-gate transistor 74 which conducts in response to the enable pulse for coupling the transistors 72, 73 to ground. The internal voltage $V'_{int}$ is established at the junction between the gate of NMOS transistor 72 and the drain of a PMOS transistor 75 whose gate and source are connected to the drain of transistor 71 and the voltage supply $V_{cc}$, respectively, to form a feedback circuit to keep the voltage $V'_{int}$ at a constant level in the same manner as the second internal voltage generator 3. The internal voltage $V'_{int}$ is the power supply voltage of the first buffer amplifier 6. Both of the third reference voltage source 60 and the second internal voltage generator 61 are operated to produce their outputs only during the test mode. Since the first buffer amplifier 6 is operated with a higher power voltage than in the case of the FIG. 1 prior art, the threshold voltages of its transistors is lowered, extending the range of measurement, and the Shmoo plot of FIG. 4 is obtained prior to the adjustment of the variable resistors of the second reference voltage source 2.

What is claimed is:

1. A power supply circuit for an integrated-circuit chip, comprising:

a first voltage reference source configured to output a first voltage reference V1;

a second voltage reference source connected to receive the first voltage reference V1 from the first voltage reference source and to output a second voltage reference V2;

a third voltage reference source connected to receive the first voltage reference V1 from the first voltage reference source and to output a third voltage reference V3, wherein the third voltage reference V3 is greater in magnitude than the second voltage reference V2;

a first internal voltage generator connected to receive the second voltage reference V2 from the second voltage reference source and to output a first internal voltage Vint1;

a second internal voltage generator connected to receive the third voltage reference V3 from the second voltage reference source and to output a second internal voltage Vint2, wherein the second internal voltage Vint2 is greater in magnitude than the first internal voltage Vint1;

a comparator connected to receive a test voltage output from a test circuit and the first internal voltage Vint1 output from the first internal voltage generator, the comparator being powered by the first internal voltage Vint1 and being configured to produce a first output voltage VD1 that is based on a difference between the first internal voltage Vint1 and the test voltage;

a first buffer amplifier connected to receive the first output voltage VD1 from the comparator and the second internal voltage Vint2 from the second internal voltage source, the first buffer amplifier being powered by the second internal voltage Vint2, the first buffer amplifier being configured to output a pair of voltages VD2 and VD3 which are based on the first output voltage VD1; and a second buffer amplifier connected to receive the pair of voltages VD2 and VD3 output by the first buffer amplifier, the second buffer amplifier further connected to receive an externally supplied voltage, the second buffer amplifier providing an output voltage Vo to the test circuit, the output voltage Vo being based on the pair of voltages VD2 and VD3.

2. A power supply circuit as claimed in claim 1, wherein the first voltage reference source comprises a first pair of series-connected variable resistors, and wherein the second voltage reference source comprises a second pair of series-connected variable resistors, and wherein a resistance of the first-pair of series connected variable resistors is higher than a resistance of the second pair of series connected variable resistors.

3. A power supply circuit as claimed in claim 1, wherein the third voltage reference source and the second internal voltage generator are each configured to receive a test mode signal, and wherein the third voltage reference source and the second internal voltage generator only provide outputs during a test mode as determined by receipt of the test mode signal.

4. A power supply circuit as claimed in claim 3, wherein the test mode signal is not supplied to the first voltage reference source, the second voltage reference source, and the first internal voltage generator, and wherein the first voltage reference source, the second voltage reference source, and the first internal voltage generator provide outputs during the test mode and during a normal operation mode.

5. A power supply circuit as claimed in claim 1, wherein the first, second and third voltage reference sources are connected to receive the externally-supplied voltage, and wherein the third voltage reference source comprises:

a pair of PMOS transistors connected to receive the externally-supplied voltage;

a pair of NMOS transistors respectively connected to the pair of PMOS transistors;

a pair of series-connected variable resistors having a common node between the series-connected pair, the common node being connected to the one of the pair of NMOS transistors; and a PMOS transistor connected to one of the pair of PMOS transistors and one of the pair of NMOS transistors, the PMOS transistor being further connected to one of the pair of series-connected variable resistors, wherein a node defining a connection between the PMOS transistor and the one of the pair of series-connected variable resistors corresponds to an output port of the third voltage reference source.

6. A power supply circuit as claimed in claim 5, wherein said pair of PMOS transistors are configured to function as a current mirror, and wherein said pair of NMOS transistors are configured to function as a differential amplifier.

7. A power supply circuit as claimed in claim 5, wherein the second internal voltage generator comprises:

a second pair of PMOS transistors connected to receive the externally-supplied voltage;

a second pair of NMOS transistors respectively connected to the second pair of PMOS transistors; and a second PMOS transistor connected to one of the second pair of PMOS transistors and one of the second pair of NMOS transistors, wherein the one of the second pair of PMOS transistors is connected to the output port of the third voltage reference source, and wherein a gate of the other of the second pair of PMOS transistors corresponds to an output port of the second internal voltage generator.

8. A power supply circuit as claimed in claim 7, wherein said second pair of PMOS transistors are configured to function as a current mirror, and wherein said second pair of NMOS transistors are configured to function as a differential amplifier.

* * * * *